(12) United States Patent
Park et al.

(10) Patent No.: US 8,715,538 B2
(45) Date of Patent: *May 6, 2014

(54) THERMOELECTRIC CONVERSION MATERIAL AND PRODUCING METHOD THEREOF; AND THERMOELECTRIC CONVERSION ELEMENT USING THE SAME

(75) Inventors: Cheol-Hee Park, Daejeon (KR); Se-Hui Sohn, Daejeon (KR); Seung-Tae Hong, Daejeon (KR); Won-Jong Kwon, Daejeon (KR); Tae-Hoon Kim, Seol (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/531,186

(22) Filed: Jun. 22, 2012

(65) Prior Publication Data

US 2012/0326100 A1 Dec. 27, 2012

Related U.S. Application Data

(63) Continuation of application No. 12/906,917, filed on Oct. 18, 2010, now Pat. No. 8,226,843, which is a continuation of application No. PCT/KR2008/007041, filed on Nov. 28, 2008.

(30) Foreign Application Priority Data

| Aug. 29, 2008 | (KR) | 10-2008-0085240 |
| Oct. 6, 2008 | (KR) | 10-2008-0097779 |
| Nov. 11, 2008 | (KR) | 10-2008-0111557 |

(51) Int. Cl.
 *H01B 1/08* (2006.01)
 *H01L 29/12* (2006.01)

(52) U.S. Cl.
 USPC .................. 252/519.4; 252/62.3 T; 136/240

(58) Field of Classification Search
 USPC .................. 252/62.3 T, 519.4; 136/240, 256
 See application file for complete search history.

(56) References Cited

U.S. PATENT DOCUMENTS

| 4,366,336 A | 12/1982 | Donaghey |
| 5,418,007 A | 5/1995 | Debe |

(Continued)

FOREIGN PATENT DOCUMENTS

| JP | 11-031849 | 2/1999 |
| JP | 11-186616 | 7/1999 |

(Continued)

OTHER PUBLICATIONS

Ohtani et al "Electrical Properties of layered copper oxyselenides (BiO)Cu1-xSe and (Bi1-xSrx)OCuSe", Journal of Alloys and Compounds 262-263 (1997) 175-179.*

(Continued)

*Primary Examiner* — Mark Kopec
(74) *Attorney, Agent, or Firm* — McKenna Long & Aldridge

(57) ABSTRACT

Thermoelectric conversion materials, expressed by the following formula: $Bi_{1-x}M_xCu_wO_{a-y}Q1_yTe_{b-z}Q2_z$. Here, M is at least one element selected from the group consisting of Ba, Sr, Ca, Mg, Cs, K, Na, Cd, Hg, Sn, Pb, Mn, Ga, In, Tl, As and Sb; Q1 and Q2 are at least one element selected from the group consisting of S, Se, As and Sb; x, y, z, w, a, and b are $0 \leq x < 1$, $0 < w \leq 1$, $0.2 < a < 4$, $0 \leq y < 4$, $0.2 < b < 4$ and $0 \leq z < 4$. These thermoelectric conversion materials may be used for thermoelectric conversion elements, where they may replace thermoelectric conversion materials in common use, or be used along with thermoelectric conversion materials in common use.

14 Claims, 12 Drawing Sheets

(56) References Cited

U.S. PATENT DOCUMENTS

| | | |
|---|---|---|
| 5,431,021 A | 7/1995 | Gwilliam et al. |
| 5,487,952 A | 1/1996 | Yoo et al. |
| 5,726,381 A | 3/1998 | Horio et al. |
| 6,091,014 A | 7/2000 | Eklund et al. |
| 6,251,701 B1 | 6/2001 | McCandless |
| 6,444,894 B1 | 9/2002 | Sterzel |
| 6,660,925 B1 | 12/2003 | Sharp |
| 6,743,973 B2 | 6/2004 | Hayashi et al. |
| 6,942,728 B2 | 9/2005 | Caillat et al. |
| 7,091,136 B2 | 8/2006 | Basol |
| 7,649,139 B2 | 1/2010 | Mihara et al. |
| 2003/0110892 A1 | 6/2003 | Nicoloau |
| 2005/0139249 A1 | 6/2005 | Ueki et al. |
| 2011/0017935 A1 | 1/2011 | Park et al. |

FOREIGN PATENT DOCUMENTS

| | | |
|---|---|---|
| JP | 2001-223392 | 8/2001 |
| JP | 2002-232026 | 8/2002 |
| JP | 2004-288841 | 10/2004 |
| JP | 2007-258200 | 10/2007 |
| JP | 2008-085309 | 4/2008 |

OTHER PUBLICATIONS

B.A. Popovkin et al., "New Layered Phases of the MOCuX (M=Ln, Bi; X=S, Se, Te) Family: A Geometric Approach to the Explanation of Phase Stability", Russian Journal of Inorganic Chemistry, vol. 43, No. 10, 1998, pp. 1471-1475.

Kouichi Takase et al., "Charge Density Distribution of Transparent p-type Semiconductor (LaO) CuS", Applied Physics Letters 90, (2007) pp. 161916 (1-3).

Evans et al "Synthesis and characterization of the new oxyselenide $Bl2YO4Cu2Se2$", Chem. Commun., 2002, 912-913.

* cited by examiner

THERMOELECTRIC CONVERSION MATERIAL AND PRODUCING METHOD THEREOF; AND THERMOELECTRIC CONVERSION ELEMENT USING THE SAME

CROSS REFERENCE TO RELATED APPLICATIONS

This application is a continuation of U.S. Ser. No. 12/906,917, filed on Oct. 18, 2010, now issued as U.S. Pat. No. 8,226,843, which is a continuation of International Application No. PCT/KR2008/007041 filed Nov. 28, 2008, which claims priorities to Korean Patent Applications Nos. 10-2008-0085240, 10-2008-0097779 and 10-2008-0111557 filed in Republic of Korea on Aug. 29, 2008, Oct. 6, 2008 and Nov. 11, 2008, respectively, the entire contents of which are incorporated herein by reference.

TECHNICAL FIELD

The present invention provides new thermoelectric conversion material, their method of preparation, and thermoelectric conversion elements by using the same.

BACKGROUND OF THE INVENTION

The thermoelectric conversion element is applied to thermoelectric conversion power generation or thermoelectric conversion cooling. For example, for the thermoelectric conversion power generation, a temperature difference is applied to the thermoelectric conversion element to generate thermoelectromotive force, and then the thermoelectromotive force is used to convert thermal energy into electric energy.

Energy conversion efficiency of the thermoelectric conversion element depends on ZT value that is a performance index of thermoelectric conversion material. ZT value is determined by Seebeck coefficient, electric conductivity and thermal conductivity. In more detail, ZT value is in proportion to electric conductivity and square of Seebeck coefficient and in reverse proportion to thermal conductivity. Thus, in order to enhance the energy conversion efficiency of a thermoelectric conversion element, it is required to develop thermoelectric conversion materials with high Seebeck coefficient, high electric conductivity or low thermal conductivity.

DISCLOSURE

Technical Problem

An object of the present invention is to provide new thermoelectric conversion material having excellent thermoelectric conversion performance.

Another object of the present invention is to provide a method for producing the above new thermoelectric conversion material.

Furthermore, another object of the present invention is to provide a thermoelectric conversion element using the new thermoelectric conversion material.

Technical Solution

As a result of the research for thermoelectric conversion material, compositions of the formula 1 are proposed in the present invention. It was found that these new compounds may be used as thermoelectric conversion materials of thermoelectric conversion elements, and so on.

$$Bi_{1-x}M_xCu_wO_{a-y}Q1_yTe_{b-z}Q2_z \quad \text{Formula 1}$$

where M is at least one element selected from the group consisting of Ba, Sr, Ca, Mg, Cs, K, Na, Cd, Hg, Sn, Pb, Mn, Ga, In, Tl, As and Sb; Q1 and Q2 are at least one element selected from the group consisting of S, Se, As and Sb with $0 \leq x < 1$, $0 < w \leq 1$, $0.2 < a < 4$, $0 \leq y < 4$, $0.2 < b < 4$ and $0 \leq z < 4$.

According to the present invention, x, y and z of the formula 1 are x+y+z>0, and a, y, b and z are preferably a=1, $0 \leq y < 1$, b=1 and $0 \leq z < 1$, respectively.

In other case, x, w, a, y, b and z are preferably $0 \leq x < 0.15$, $0.8 \leq w \leq 1$, a=1, $0 \leq y < 0.2$, b=1 and $0 \leq z < 0.5$, respectively. Here, M is preferably any one selected from the group consisting of Sr, Cd, Pb and Tl, and Q1 and Q2 are preferably Se or Sb, respectively.

In another aspect of the present invention, it provides methods for producing thermoelectric conversion materials expressed by the above formula 1 by heating mixtures of $Bi_2O_3$, Bi, Cu and Te.

Alternatively, the present invention provides methods for producing thermoelectric conversion materials expressed by the formula 1 by heating mixtures of $Bi_2O_3$, Bi, Cu, Te, and at least one selected from the group consisting of elemental Ba, Sr, Ca, Mg, Cs, K, Na, Cd, Hg, Sn, Pb, Mn, Ga, In, Tl, As and Sb, or their oxides.

Also alternatively, the present invention provides methods for producing thermoelectric conversion materials expressed by the formula 1 by heating mixtures of $Bi_2O_3$, Bi, Cu, Te, at least one selected from the group consisting of elemental S, Se, As, and Sb, or their oxides, and optionally at least one selected from the group consisting of elemental Ba, Sr, Ca, Mg, Cs, K, Na, Cd, Hg, Sn, Pb, Mn, Ga, In, Tl, As, and Sb, or their oxides.

In the method according to the present invention, the sintering process is preferably executed at temperatures of 400 to 570° C.

Advantageous Effects

The new thermoelectric conversion materials of the present invention may replace thermoelectric conversion materials in common use, or be used along with thermoelectric conversion materials in common use. In particular, the thermoelectric conversion materials may be useful for thermoelectric conversion elements due to their excellent thermoelectric conversion performance.

DESCRIPTION OF DRAWINGS

Other objects and aspects of the present invention will become apparent from the following description of embodiments with reference to the accompanying drawing in which.

BEST MODE

Figure 1:
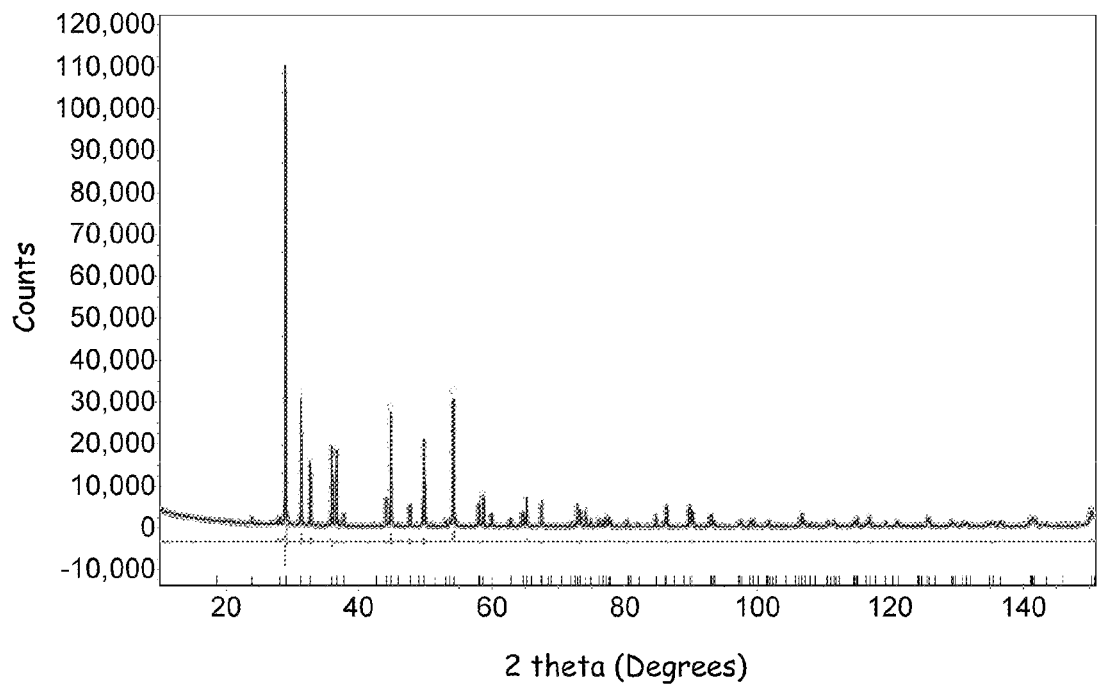
FIG. 1 shows Rietveld refinement profiles for BiCuOTe, comparing X-ray diffraction pattern with a calculated pattern from a structural model.

Compositions of the thermoelectric conversion materials of the present invention are expressed by the following formula 1.

$$Bi_{1-x}M_xCu_wO_{a-y}Q1_yTe_{b-z}Q2_z \quad \text{Formula 1}$$

In the formula 1, M is at least one element selected from the group consisting of Ba, Sr, Ca, Mg, Cs, K, Na, Cd, Hg, Sn, Pb, Mn, Ga, In, Tl, As and Sb, and Q1 and Q2 are at least one element selected from the group consisting of S, Se, As and Sb with $0 \leq x < 1$, $0 < w \leq 1$, $0.2 < a < 4$, $0 \leq y < 4$, $0.2 < b < 4$ and $0 \leq z < 4$.

In the formula 1, x, y, and z are preferably $0 \leq x \leq \frac{1}{2}$, $0 \leq y \leq a/2$ and $0 \leq z \leq b/2$, respectively.

In the formula 1, x, y, and z may be respectively $x=0$, $y=0$ and $z=0$. The thermoelectric conversion material of the formula 1 is preferably BiCuOTe.

In the formula 1, x, y, and z are $x+y+z>0$, and a, y, b and z of the formula 1 are preferably $a=1$, $0 \leq y < 1$, $b=1$ and $0 \leq z < 1$, respectively. In other cases, x, w, a, y, b and z may be respectively $0 \leq x < 0.15$, $0.8 \leq w \leq 1$, $a=1$, $0 \leq y < 0.2$, $b=1$ and $0 \leq z < 0.5$. Here, M is preferably any one selected from the group consisting of Sr, Cd, Pb and Tl, and Q1 and Q2 are preferably Se or Sb, respectively. More preferably, x, w, a, y, b and z of the formula 1 are respectively $0 \leq x < 0.15$, $0.8 \leq w \leq 1$, $a=1$, $0 \leq y < 0.2$, $b=1$ and $0 \leq z < 0.5$, M is any one selected from the group consisting of Sr, Cd, Pb and Tl, and Q1 and Q2 are respectively Se or Sb.

For the thermoelectric conversion materials of the formula 1, it is more preferred that x, w, a, y, b and z of the formula 1 are respectively $0 < x < 0.15$, $w=1$, $a=1$, $y=0$, $b=1$ and $z=0$, and M is any one selected from the group consisting of Sr, Cd, Pb and Tl. In addition, in the formula 1 where x, w, y and z of the formula 1 are respectively $x=0$, $w=1$, $a=1$, $y=0$, $b=1$ and $0 < z \leq 0.5$, and Q2 is Se or Sb, it is more preferred that x, w, a, y, b and z of the formula 1 are respectively $0 < x < 0.15$, $w=1$, $a=1$, $y=0$, $b=1$ and $z=0$, and M is any one selected from the group consisting of Sr, Cd, Pb and Tl.

Meanwhile, the thermoelectric conversion materials expressed by the formula 1 may be produced by mixing powders of $Bi_2O_3$, Bi, Cu and Te and then vacuum-sintering the mixture, but the present invention is not limited thereto.

Also, the thermoelectric conversion materials expressed by the formula 1 may be produced by heating mixtures of $Bi_2O_3$, Bi, Cu, Te, and at least one selected from the group consisting of Ba, Sr, Ca, Mg, Cs, K, Na, Cd, Hg, Sn, Pb, Mn, Ga, In, Tl, As and Sb, or their oxides in an evacuated silica tube, however the present invention is not limited thereto.

In addition, the thermoelectric conversion materials expressed by the formula 1 may be produced by heating mixtures of $Bi_2O_3$, Bi, Cu, Te, at least one element selected from the group consisting of S, Se, As and Sb, or their oxides, and optionally at least one selected from the group consisting of Ba, Sr, Ca, Mg, Cs, K, Na, Cd, Hg, Sn, Pb, Mn, Ga, In, Tl, As, and Sb, or their oxides in an evacuated silica tube, however the present invention is not limited thereto.

The thermoelectric conversion materials of the present invention may be produced by sintering mixtures in a flowing gas such as Ar, He or $N_2$, which partially includes hydrogen or does not include hydrogen. The sintering process is preferably executed at a temperature of 400 to 750° C., more preferably 400 to 570° C.

MODE FOR INVENTION

Hereinafter, the preferred embodiment of the present invention will be described in detail based on examples. However, the embodiments of the present invention may be modified in various ways, and the scope of the present invention should not be interpreted as being limited to the examples. The embodiments of the present invention are provided just for explaining the present invention more perfectly to those having ordinary skill in the art.

Example 1

BiCuOTe

In order to prepare BiCuOTe, 1.1198 g of $Bi_2O_3$ (Aldrich, 99.9%, 100 mesh), 0.5022 g of Bi (Aldrich, 99.99%, <10 m), 0.4581 g of Cu (Aldrich, 99.7%, 3 m), and 0.9199 g of Te (Aldrich, 99.99%, ~100 mesh) were well mixed by using agate mortar, and then heated in an evacuated silica tube at 510° C. for 15 hours, thereby obtaining BiCuOTe powder.

The powder X-ray diffraction (XRD) data were collected at room temperature on a Bragg-Brentano diffractometer (Bruker Advance D8 XRD) with a Cu X-ray tube ($\lambda=1.5406$ Å, 50 kV, 40 mA). The step size was 0.02 degree.

TOPAS program (R. W. Cheary, A. Coelho, J. Appl. Crystallogr. 25 (1992) 109-121; Bruker AXS, TOPAS 3, Karlsruhe, Germany (2000)) was used in order to determine the crystal structure of the obtained material. The analysis results are shown in Table 1 and FIG. 2.

TABLE 1

| Crystallographic data obtained from Rietveld refinement of BiCuOTe [Space group I4/nmm (No. 129), a = 4.04138(6) Å, c = 9.5257(2) Å] | | | | | |
|---|---|---|---|---|---|
| Atom | site | x | y | z | Occup. | Beq |
| Bi | 2c | 0.25 | 0.25 | 0.37257(5) | 1 | 0.56(1) |
| Cu | 2a | 0.75 | 0.25 | 0 | 1 | 0.98(3) |
| O | 2b | 0.75 | 0.25 | 0.5 | 1 | 0.26(12) |
| Te | 2c | 0.25 | 0.25 | 0.81945(7) | 1 | 0.35(1) |

FIG. 1 shows a Rietveld refinement profile that compares observed X-ray diffraction pattern of BiCuOTe with a calculated X-ray diffraction pattern from a structural model. FIG. 1 shows that the measured pattern well agrees with the calculated pattern according to Table 1, which implies that the material obtained in this example is BiCuOTe.

Figure 2:
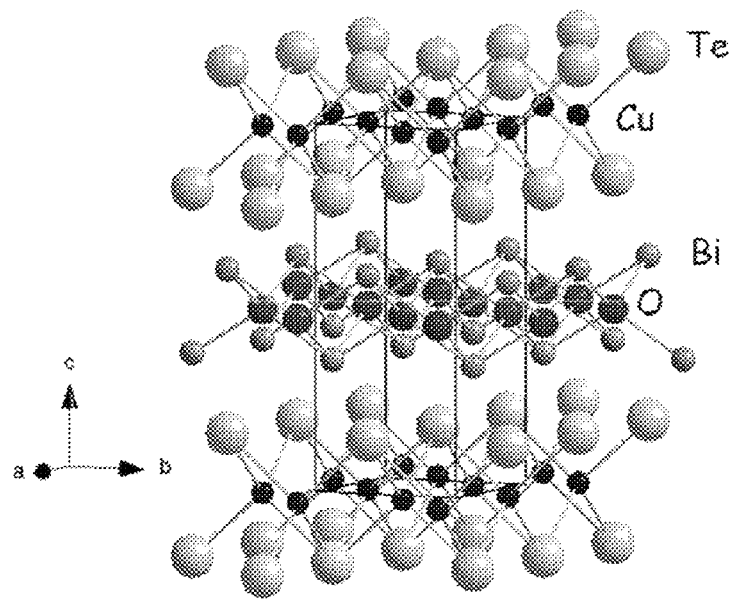
FIG. 2 shows the crystal structure of BiCuOTe.

As shown in FIG. 2, the BiCuOTe exhibits a natural super-lattice structure in which $Cu_2Te_2$ layers and $Bi_2O_2$ layers are repeated along a c-crystalline axis.

Example 2

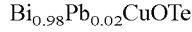

$Bi_{0.98}Pb_{0.02}CuOTe$

In order to prepare $Bi_{0.98}Pb_{0.02}CuOTe$, 2.5356 g of $Bi_2O_3$ (Aldrich, 99.9%, 100 mesh), 1.1724 g of Bi (Aldrich, 99.99%, <10 m), 1.0695 g of Cu (Aldrich, 99.7%, 3 m), 0.0751 g of PbO (Canto, 99.5%), and 2.1475 g of Te (Aldrich, 99.99%, ~100 mesh) were well mixed by using agate mortar, and then heated in an evacuated silica tube at 510r for 15 hours, thereby obtaining $Bi_{0.98}Pb_{0.02}CuOTe$ powder.

The powder X-ray diffraction (XRD) data were collected at room temperature on a Bragg-Brentano diffractometer (Bruker D4-Endeavor XRD) with a Cu X-ray tube ($\lambda$=1.5406 Å, 50 kV, 40 mA). The step size was 0.02 degree.

TOPAS program (R. W. Cheary, A. Coelho, J. Appl. Crystallogr. 25 (1992) 109-121; Bruker AXS, TOPAS 3, Karlsruhe, Germany (2000)) was used in order to determine the crystal structure of the obtained material. The analysis results are shown in Table 2 and FIG. 4.

TABLE 2

Crystallographic data obtained from Rietveld refinement of $Bi_{0.98}Pb_{0.02}CuOTe$ [Space group P4/nmm (No. 129), a = 4.04150(4) Å, c = 9.53962(13) Å]

| Atom | site | x | y | z | Occup. | Beq. |
|------|------|------|------|-------------|--------|---------|
| Bi | 2c | 0.25 | 0.25 | 0.37225(12) | 0.98 | 0.59(4) |
| Pb | 2c | 0.25 | 0.25 | 0.37225(12) | 0.02 | 0.59(4) |
| Cu | 2a | 0.75 | 0.25 | 0 | 1 | 1.29(10) |
| O | 2b | 0.75 | 0.25 | 0.5 | 1 | 0.9(4) |
| Te | 2c | 0.25 | 0.25 | 0.81955(17) | 1 | 0.55(5) |

Figure 3:
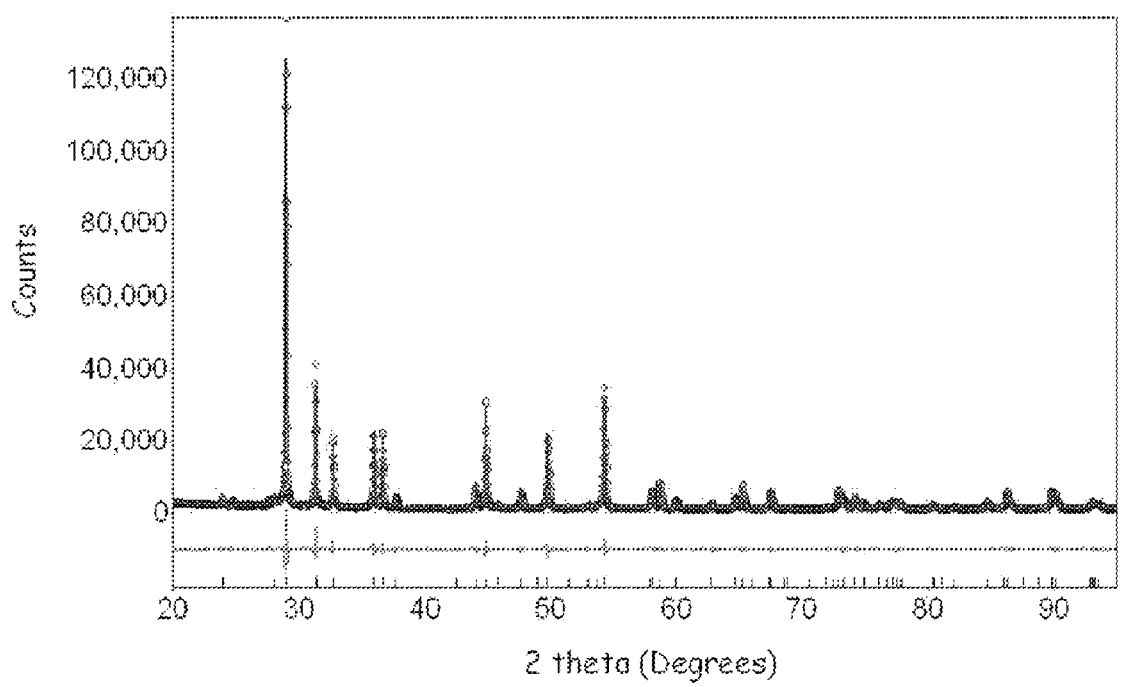
FIG. 3 shows Rietveld refinement profiles for $Bi_{0.98}Pb_{0.02}CuOTe$, comparing X-ray diffraction pattern with a calculated pattern from a structural model.

FIG. 3 shows a Rietveld refinement profile that compares observed X-ray diffraction pattern of $Bi_{0.98}Pb_{0.02}CuOTe$ with calculated pattern of a structural model. FIG. 3 shows that the measured pattern well agrees with the calculated pattern according to Table 2, which implies that the material obtained in this example is $Bi_{0.98}Pb_{0.02}CuOTe$.

Figure 4:
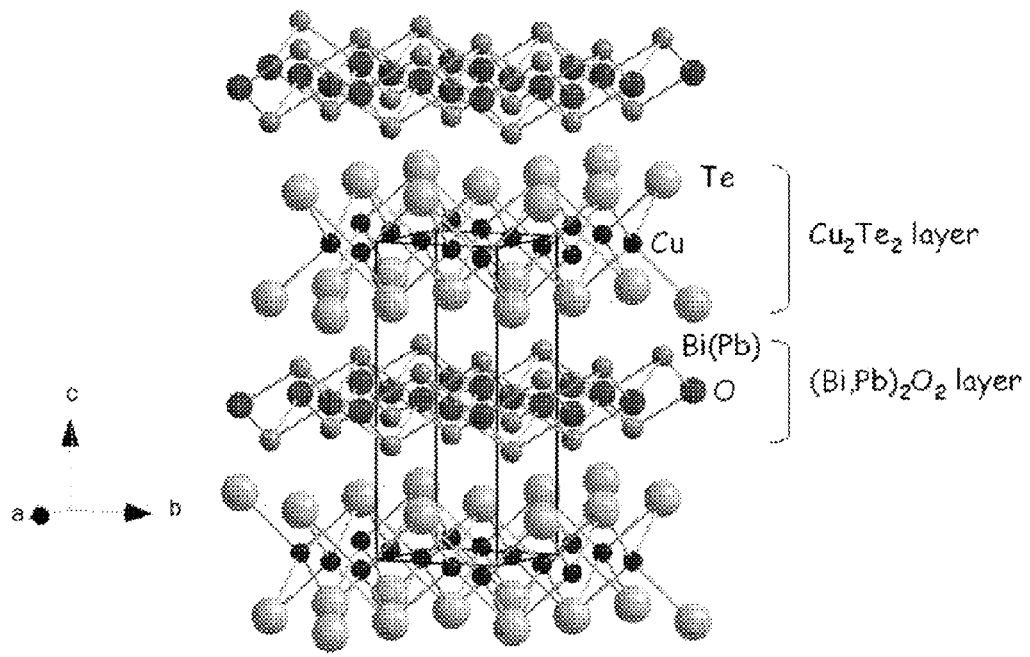
FIG. 4 shows the crystal structure of $Bi_{0.98}Pb_{0.02}CuOTe$.

As shown in FIG. 4, the $Bi_{0.98}Pb_{0.02}CuOTe$ exhibits a natural super-lattice structure in which $Cu_2Te_2$ layers and $(Bi,Pb)_2O_2$ layers where Pb is partially substituted in place of Bi are repeated along a c-crystalline axis.

Example 3

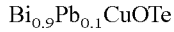

$Bi_{0.9}Pb_{0.1}CuOTe$

In order to prepare $Bi_{0.9}Pb_{0.1}CuOTe$, 1.2721 g of $Bi_2O_3$ (Aldrich, 99.9%, 100 mesh), 0.6712 g of Bi (Aldrich, 99.99%, <10 m), 0.6133 g of Cu (Aldrich, 99.7%, 3 m), 0.215 g of PbO (Canto, 99.5%), and 1.2294 g of Te (Aldrich, 99.99%, ~100 mesh) were well mixed by using agate mortar, and then heated in an evacuated silica tube at 510° C. for 15 hours, thereby obtaining $Bi_{0.9}Pb_{0.1}CuOTe$ powder.

Figure 5:
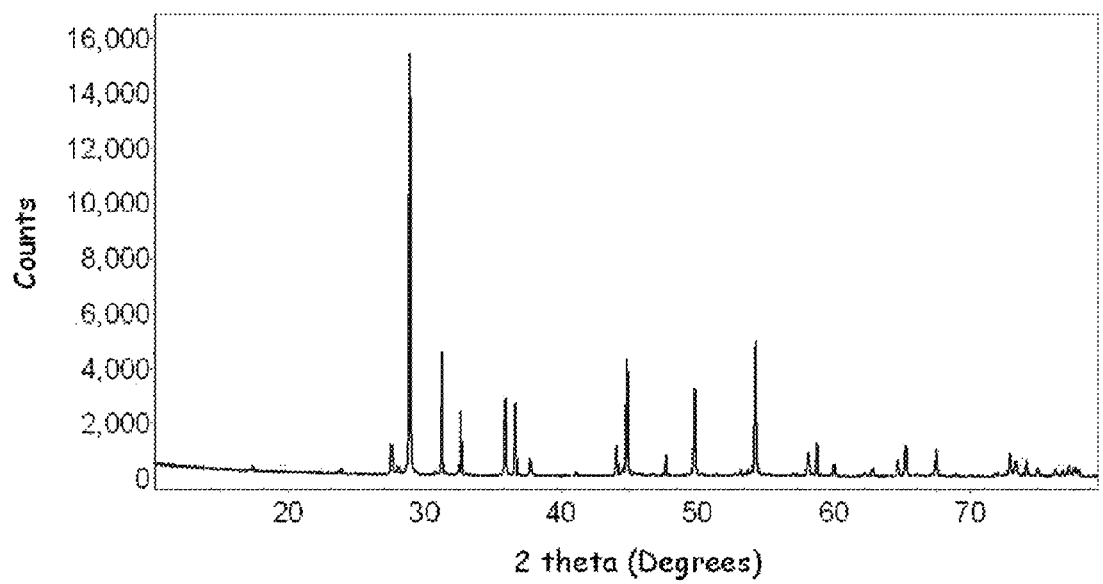
FIG. 5 shows X-ray diffraction pattern of $Bi_{0.9}Pb_{0.1}CuOTe$.

X-ray diffraction analysis was conducted for the sample in the same way as the example 2. As shown in FIG. 5, the material obtained in the example 3 was identified as $Bi_{0.9}Pb_{0.1}CuOTe$.

Example 4

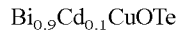

$Bi_{0.9}Cd_{0.1}CuOTe$

In order to prepare $Bi_{0.9}Cd_{0.1}CuOTe$, 1.3018 g of $Bi_2O_3$ (Aldrich, 99.9%, 100 mesh), 0.6869 g of Bi (Aldrich, 99.99%, <10 m), 0.6266 g of Cu (Aldrich, 99.7%, 3 m), 0.1266 g of CdO (Strem, 99.999%), and 1.2582 g of Te (Aldrich, 99.99%, ~100 mesh) were well mixed by using agate mortar, and then heated in an evacuated silica tube at 510° C. for 15 hours, thereby obtaining $Bi_{0.9}Cd_{0.1}CuOTe$ powder.

Figure 6:
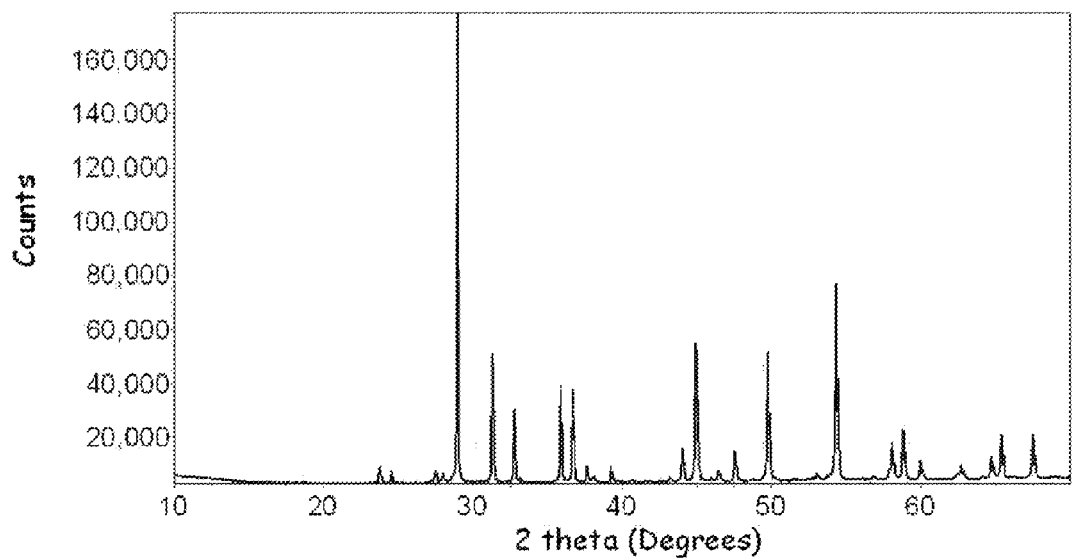
FIG. 6 shows X-ray diffraction pattern of $Bi_{0.9}Cd_{0.1}CuOTe$.

X-ray diffraction analysis was conducted for the sample in the same way as the example 2. As shown in FIG. 6, the material obtained in the example 4 was identified as $Bi_{0.9}Cd_{0.1}CuOTe$.

Example 5

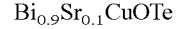

$Bi_{0.9}Sr_{0.1}CuOTe$

In order to prepare $Bi_{0.9}Sr_{0.1}CuOTe$, 1.0731 g of $Bi_2O_3$ (Aldrich, 99.9%, 100 mesh), 0.5662 g of Bi (Aldrich, 99.99%, <10 m), 0.5165 g of Cu (Aldrich, 99.7%, 3 m), 1.0372 g of Te (Aldrich, 99.99%, ~100 mesh), and 0.0842 g of SrO were well mixed by using agate mortar. Here, SrO was obtained by thermally treating $SrCO_3$ (Alfa, 99.994%) at 1125° C. for 12 hours in the air. The material obtained by thermal treatment was confirmed as SrO by X-ray diffraction analysis.

The mixture was then heated in an evacuated silica tube at 510° C. for 15 hours, thereby obtaining $Bi_{0.9}Sr_{0.1}CuOTe$ powder.

Figure 7:
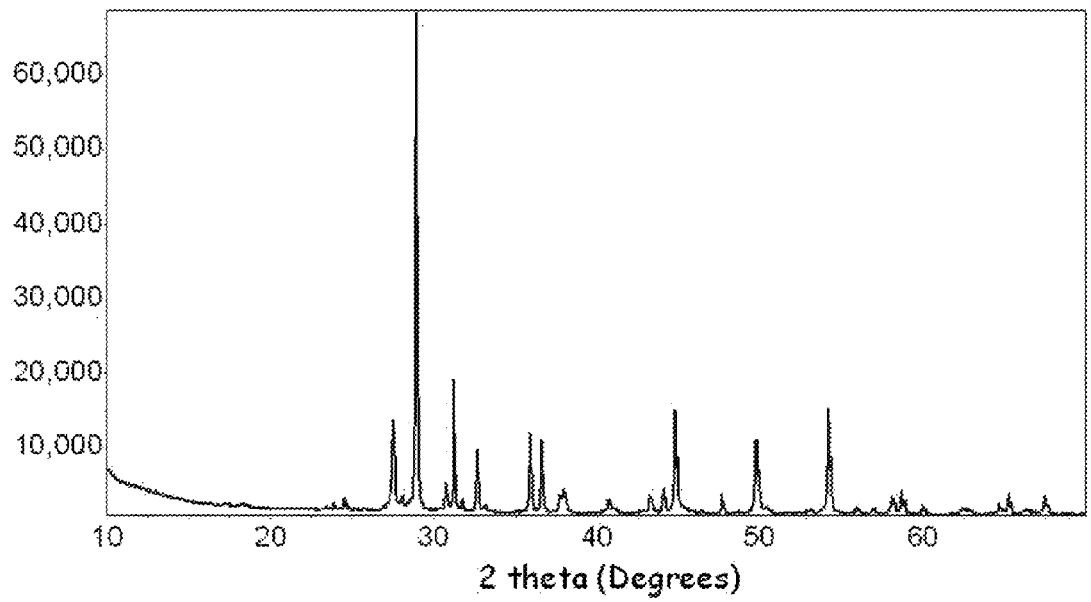
FIG. 7 shows X-ray diffraction pattern of $Bi_{0.9}Sr_{0.1}CuOTe$.

The powder X-ray diffraction (XRD) data were collected at room temperature on a Bragg-Brentano diffractometer (Bruker D8 Advance XRD) with a Cu X-ray tube ($\lambda$=1.5406 Å, 50 kV, 40 mA). The step size was 0.02 degree. FIG. 7 shows that the material obtained in the example 5 is $Bi_{0.9}Sr_{0.1}CuOTe$.

Example 6

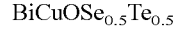

$BiCuOSe_{0.5}Te_{0.5}$

In order to prepare $BiCuOSe_{0.5}Te_{0.5}$, 1.9822 g of $Bi_2O_3$ (Aldrich, 99.9%, 100 mesh), 0.889 g of Bi (Aldrich, 99.99%, <10 m), 0.811 g of Cu (Aldrich, 99.7%, 3 m), 0.5036 g of Se (Aldrich, 99.99%), and 0.8142 g of Te (Aldrich, 99.99%, ~100 mesh) were well mixed by using agate mortar, and then heated in an evacuated silica tube at 510° C. for 15 hours, thereby obtaining $BiCuOSe_{0.5}Te_{0.5}$ powder.

Figure 8:
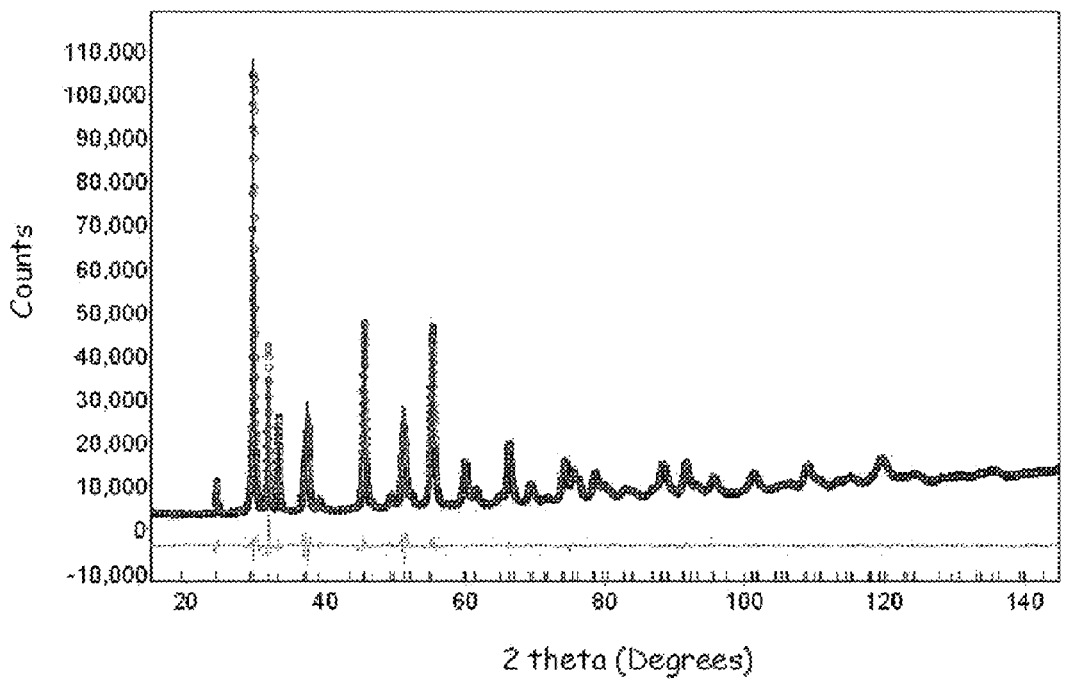
FIG. 8 shows Rietveld refinement profiles for $BiCuOSe_{0.5}Te_{0.5}$, comparing X-ray diffraction pattern with a calculated pattern from a structural model.

The powder X-ray diffraction (XRD) data were collected at room temperature on a Bragg-Brentano diffractometer (Bruker D4-Endeavor XRD) with a Cu X-ray tube (40 kV, 40 mA). The step size was 0.02 degree. At this time, variable 6 mm slit was used as a divergence slit. The results are shown in FIG. 8. Crystal structure analysis was executed in the same way as the example 2. The analysis results are shown in Table 3 and FIG. 9.

TABLE 3

Crystallographic data obtained from Rietveld
refinement of $BiCuOSe_{0.5}Te_{0.5}$ [Space group P4/nmm
(No. 129), a = 3.99045(11) Å, c = 9.2357(4) Å]

| Atom | site | x | y | z | Occup. | Beq. |
|------|------|------|------|------------|--------|---------|
| Bi | 2c | 0.25 | 0.25 | 0.36504(9) | 1 | 0.86(2) |
| Cu | 2a | 0.75 | 0.25 | 0 | 1 | 2.00(9) |
| O | 2b | 0.75 | 0.25 | 0.5 | 1 | 1.9(3) |
| Te | 2c | 0.25 | 0.25 | 0.82272(14)| 0.5 | 0.61(4) |
| Se | 2c | 0.25 | 0.25 | 0.82252(14)| 0.5 | 0.55(5) |

FIG. 8 shows that the measured pattern well agrees with the calculated pattern from the results in Table 3, and as a result the material obtained in this example is identified as $BiCuOSe_{0.5}Te_{0.5}$.

Figure 9:
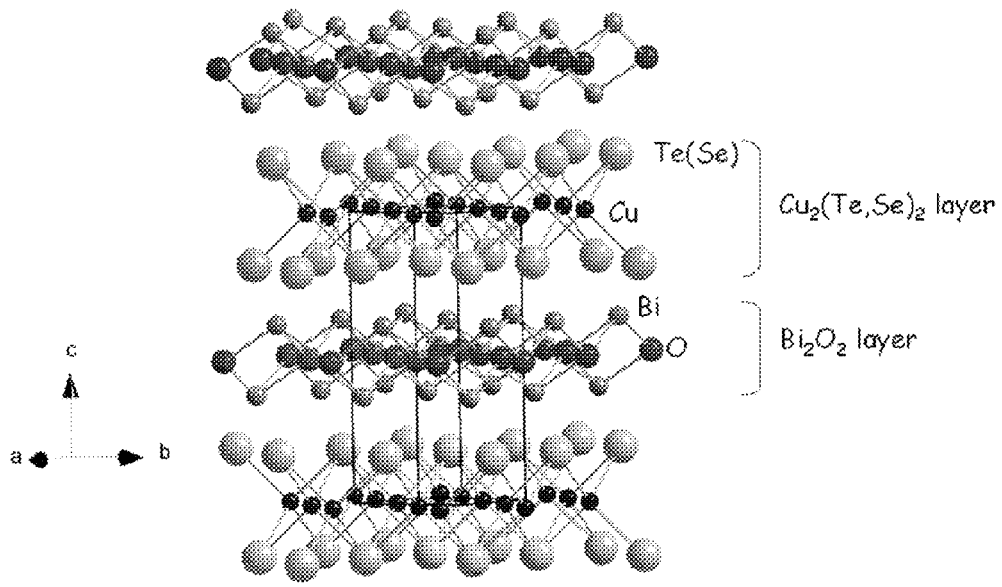
FIG. 9 shows the crystal structure of $BiCuOSe_{0.5}Te_{0.5}$.

As shown in FIG. 9, the $BiCuOSe_{0.5}Te_{0.5}$ exhibits a natural super-lattice structure in which $Cu_2(Te,Se)_2$ layers and $Bi_2O_2$ layers are repeated along a c-crystalline axis.

Example 7

$Bi_{0.9}Tl_{0.1}CuOTe$

In order to prepare $Bi_{0.9}Tl_{0.1}CuOTe$, 1.227 g of $Bi_2O_3$ (Aldrich, 99.9%, 100 mesh), 0.7114 g of Bi (Aldrich, 99.99%, <10 m), 0.6122 g of Cu (Aldrich, 99.7%, 3 m), 1.2293 g of Te (Aldrich, 99.99%, ~100 mesh), and 0.22 g of $Tl_2O_3$ (Aldrich) were well mixed by using agate mortar.

The mixture was then heated in an evacuated silica tube at 510° C. for 15 hours, thereby obtaining $Bi_{0.9}Tl_{0.1}CuOTe$ powder.

Figure 10:
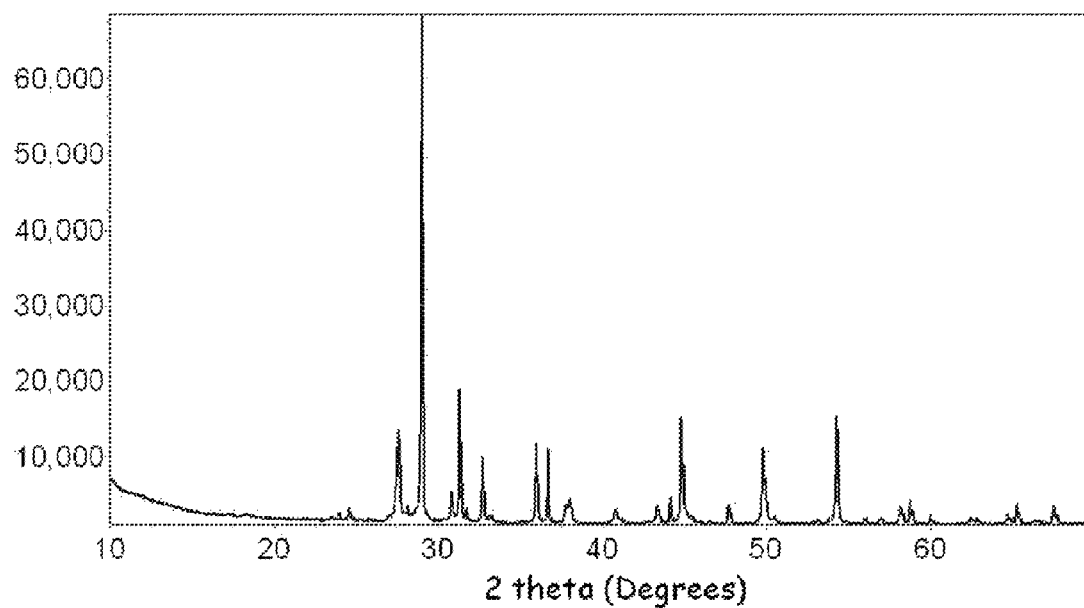
FIG. 10 shows X-ray diffraction pattern of $Bi_{0.9}Tl_{0.1}CuOTe$.

X-ray diffraction analysis was conducted for the sample in the same way as the example 2. As shown in FIG. 10, the material obtained in the example 7 was identified as $Bi_{0.9}Tl_{0.1}CuOTe$.

Example 8

$BiCuOTe_{0.9}Sb_{0.1}$

In order to prepare $BiCuOTe_{0.9}Sb_{0.1}$, 1.4951 g of $Bi_2O_3$ (Aldrich, 99.9%, 100 mesh), 0.6705 g of Bi (Aldrich, 99.99%, <10 m), 0.6117 g of Cu (Aldrich, 99.7%, 3 m), 1.1054 g of Te (Aldrich, 99.99%, ~100 mesh), and 0.1172 g of Sb (Kanto chemical, Cat. No. 01420-02) were well mixed by using agate mortar.

The mixture was then heated in an evacuated silica tube at 510° C. for 15 hours, thereby obtaining $BiCuOTe_{0.9}Sb_{0.1}$ powder.

Figure 11:
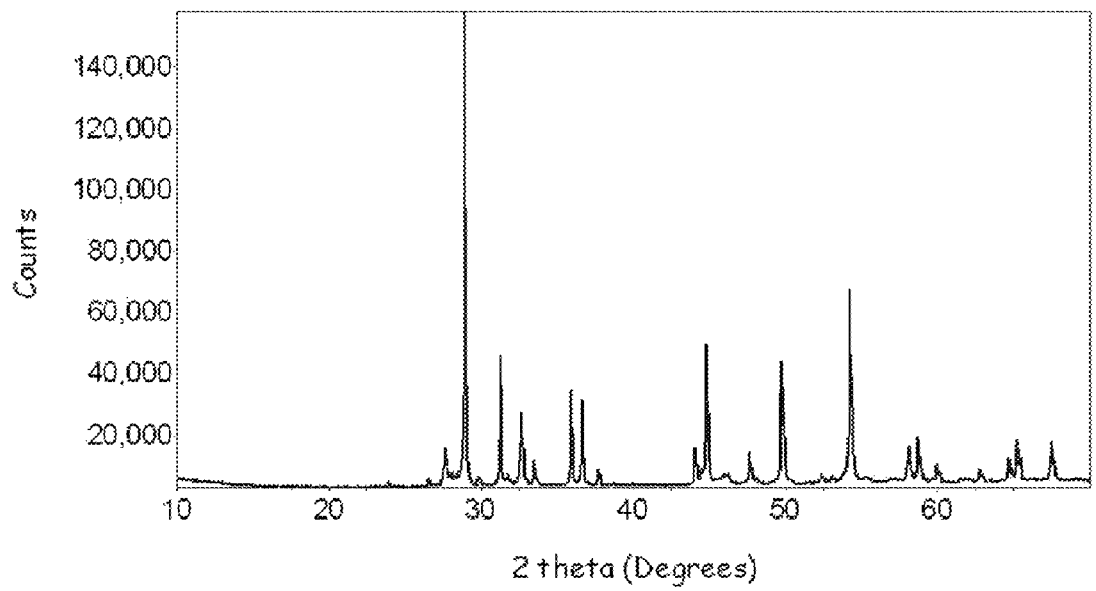
FIG. 11 shows X-ray diffraction pattern of $BiCuOTe_{0.9}Sb_{0.1}$.
Figure 12:
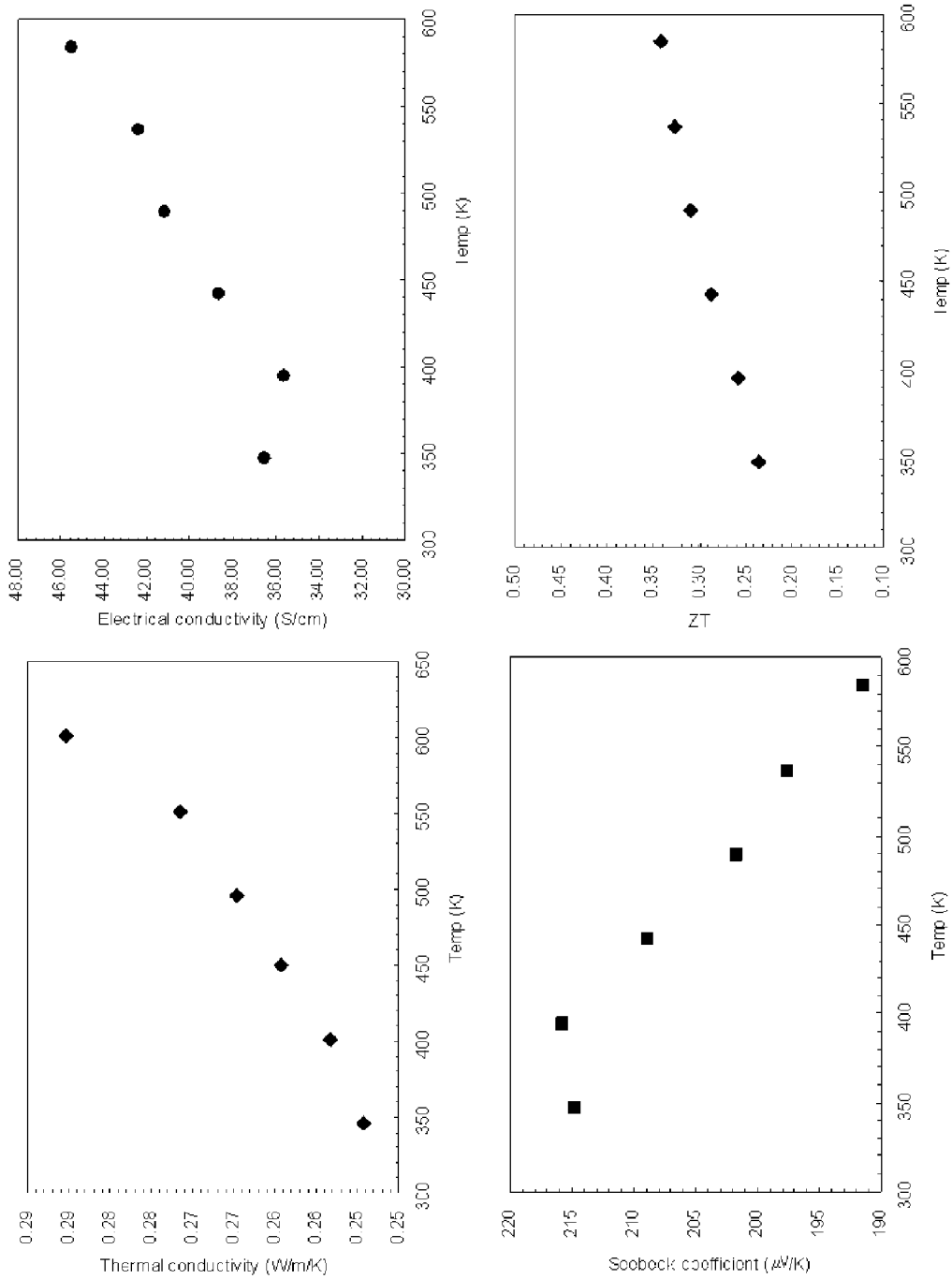
FIG. 12 shows electrical conductivities, Seebeck coefficients, thermal conductivities, and ZT values of BiCuOTe at different temperatures.
Figure 13:
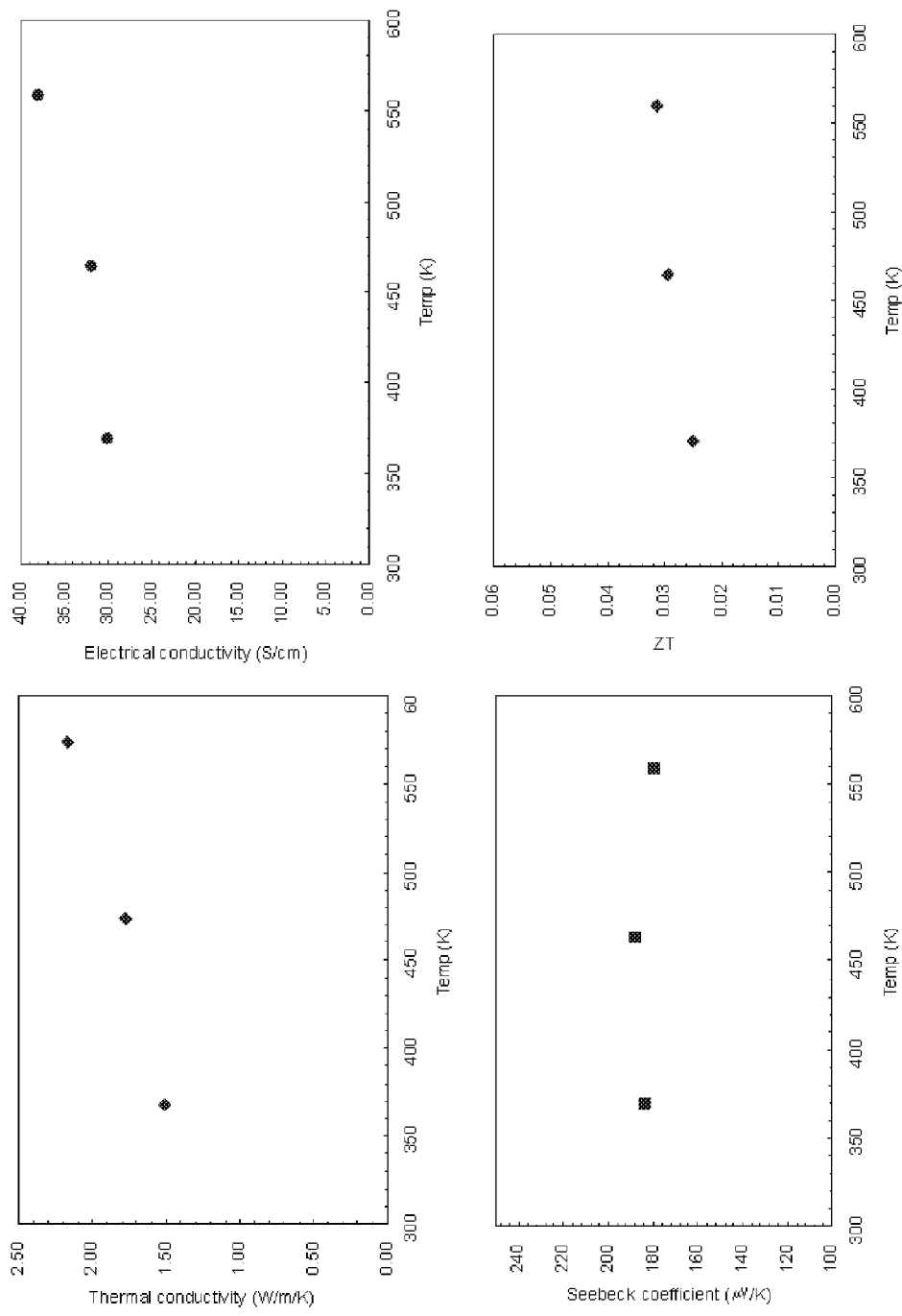
FIG. 13 shows electrical conductivities, Seebeck coefficients, thermal conductivities, and ZT values of $Bi_{0.9}Sr_{0.1}CuOTe$ at different temperatures.
Figure 14:
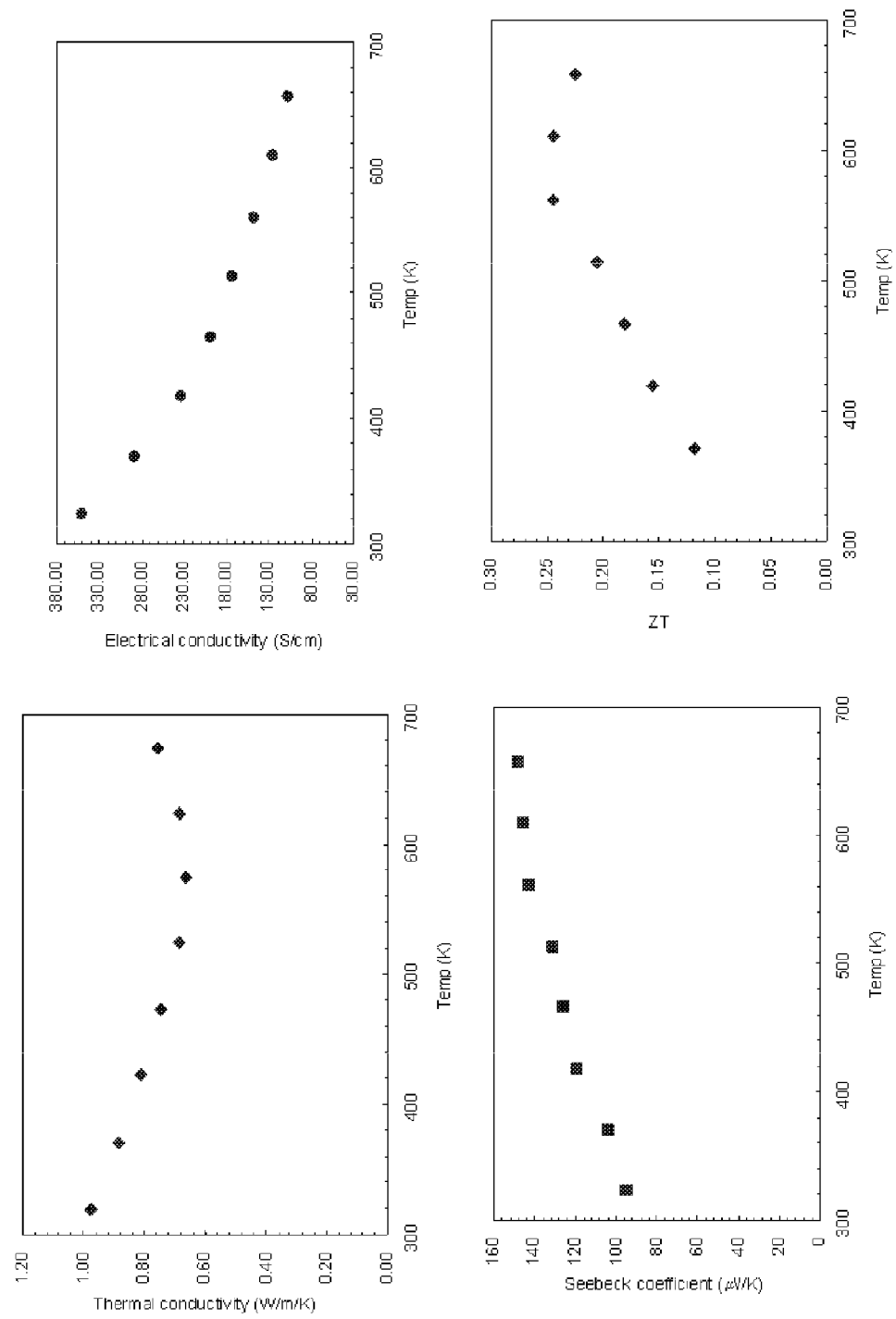
FIG. 14 shows electrical conductivities, Seebeck coefficients, thermal conductivities, and ZT values of $Bi_{0.9}Cd_{0.1}CuOTe$ at different temperatures.
Figure 15:
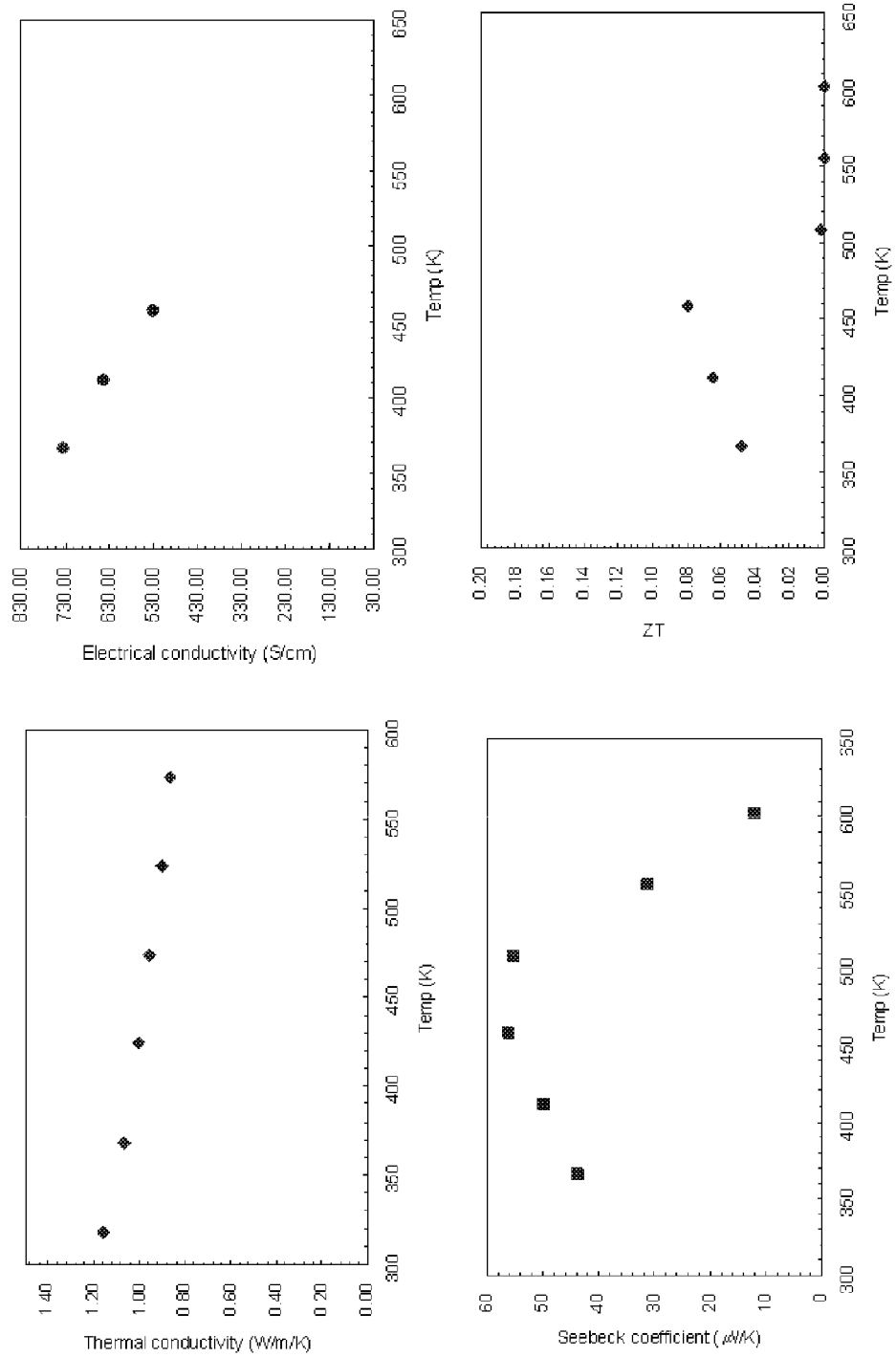
FIG. 15 shows electrical conductivities, Seebeck coefficients, thermal conductivities, and ZT values of $Bi_{0.9}Pb_{0.1}CuOTe$ at different temperatures.
Figure 16:
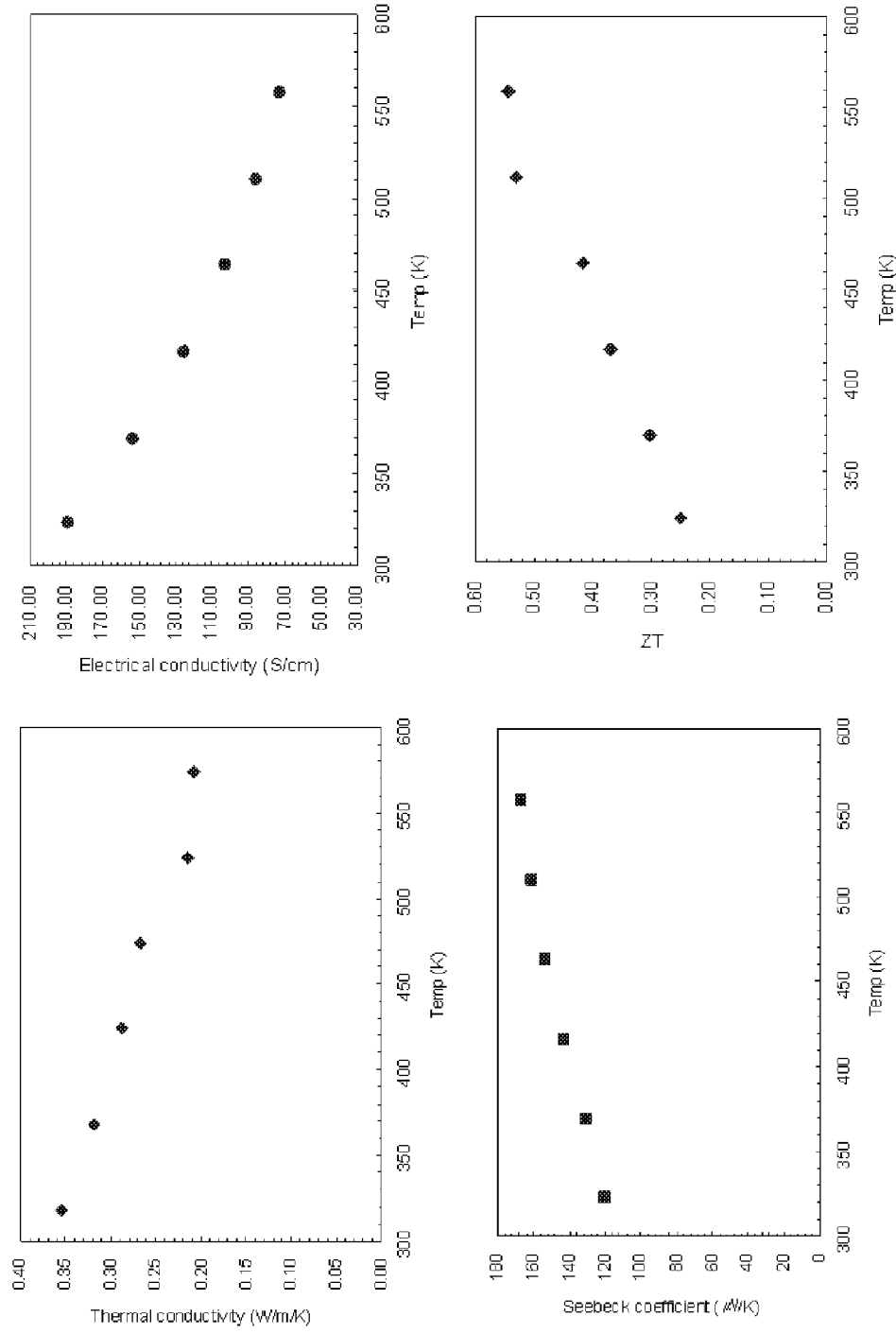
FIG. 16 shows electrical conductivities, Seebeck coefficients, thermal conductivities, and ZT values of $Bi_{0.98}Pb_{0.02}CuOTe$ at different temperatures.
Figure 17:
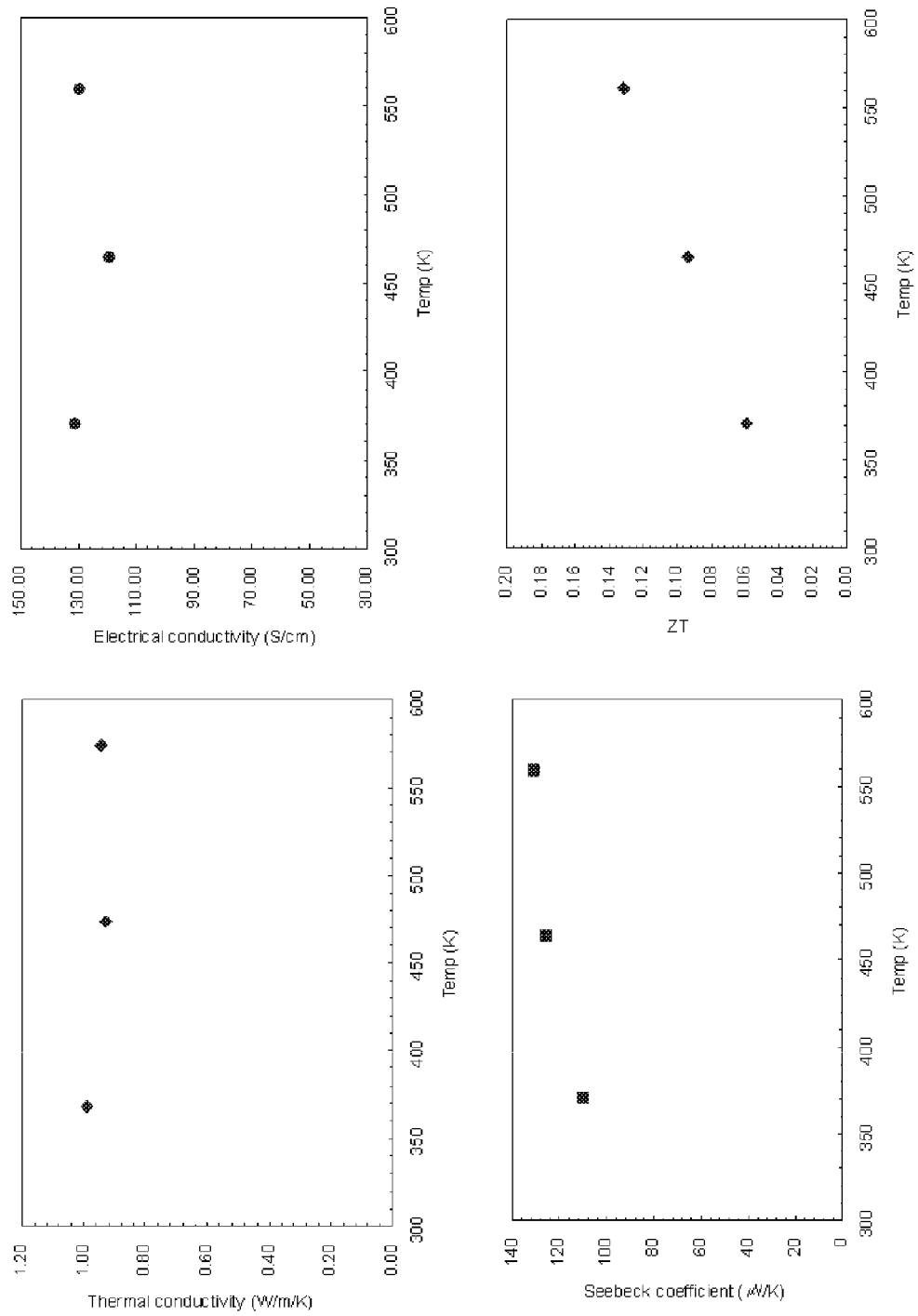
FIG. 17 shows electrical conductivities, Seebeck coefficients, thermal conductivities, and ZT values of $Bi_{0.9}Tl_{0.1}CuOTe$ at different temperatures.

X-ray diffraction analysis was conducted for the sample in the same way as the example 2. As shown in FIG. 11-2, the material obtained in the example 8 was identified as $BiCuOTe_{0.9}Sb_{0.1}$.

Evaluation of Thermoelectric Conversion Performance

Powder samples were shaped into cylinders with a diameter of 4 mm and a length of 15 mm (for electrical conductivity and Seebeck coefficient measurements), and disks having a diameter of 10 mm and a thickness of 1 mm (for thermal conductivity measurements) by using CIP at the pressure of 200 MPa. Subsequently, the resultant disks and cylinders were heated in an evacuated silica tube at 510° C. for 10 hours.

For the sintered cylinders, electric conductivity and Seebeck coefficient were measured by using a ZEM-2 (Ulvac-Rico, Inc.). The measurement results are shown in FIGS. 14 to 19. For example, at 346 K thermal conductivities of BiCuOTe and $Bi_{0.98}Pb_{0.02}CuOTe$ were measured as 0.25 W/m/K and 0.35 W/m/K, respectively, which are significantly lower than those of $Bi_2Te_3$ (1.9 W/m/K, T. M. Tritt, M. A. Subramanian, MRS Bulletin 31 (2006) 188-194) and $Co_4Sb_{12}$:$In_{0.2}$ (2 W/m/K, T. He, J. Chen, D. Rosenfeld, M. A. Subramanian, Chem. Mater. 18 (2006) 759-762) which are representative thermoelectric conversion materials.

Meanwhile, for the sintered disks, thermal conductivity was measured by using TC-9000 (Ulvac-Rico, Inc). The measurement results are shown in FIGS. 12 to 17.

ZT value of each sample was calculated using the measured values. The calculated results are shown in FIGS. 12 to 17.

The invention claimed is:

1. The thermoelectric conversion materials having a natural super-lattice structure in which $Cu_2Te_2$ layers alternate with $Bi_2O_2$ layers along a c-crystalline axis,
    wherein at least one of Bi, O and Te is partially substituted by M, Q1 and Q2, respectively,
    where M is at least one element selected from the group consisting of Ba, Sr, Ca, Mg, Cs, K, Na, Cd, Hg, Sn, Pb, Mn, Ga, In, Tl, As and Sb; Q1 and Q2 are at least one element selected from the group consisting of S, Se, As and Sb.

2. The thermoelectric conversion materials according to claim 1,
    wherein, when each of x, y and z is a ratio of the substitution by M, Q1 and Q2 in Bi, O and Te, respectively, the x, y, z and w satisfy the following relations:
    $0 \leq x \leq 1/2$, $0 \leq y \leq 1/2$ and $0 \leq z \leq 1/2$.

3. The thermoelectric conversion materials according to claim 1,
    wherein, when each of x, y and z is a ratio of the substitution by M, Q1 and Q2 in Bi, O and Te, respectively, the x, y and z satisfy the following relations:
    $x+y+z>0$.

4. The thermoelectric conversion materials according to claim 3,
    wherein, when each of x, y and z is a ratio of the substitution by M, Q1 and Q2 in Bi, O and Te, respectively, the x, y, z and w satisfy the following relations:
    $0 \leq x < 0.15$, $0 \leq y < 0.2$, $0 \leq z < 0.5$.

5. The thermoelectric conversion materials according to claim 3,
    wherein the M is any one selected from the group consisting of Sr, Cd, Pb and Tl.

6. The thermoelectric conversion materials according to claim 3,
    wherein the Q1 and Q2 are respectively Se or Sb.

7. The thermoelectric conversion materials according to claim 3,
    wherein x, y, z satisfy the following relations:
    $0 \leq x < 0.15$, $0 \leq y < 0.2$, $0 \leq z < 0.5$ and;
    the M is any one selected from the group consisting of Sr, Cd, Pb and Tl; and
    the Q1 and Q2 are respectively Se or Sb.

8. The thermoelectric conversion materials according to claim 7,
    wherein the x, y, and z satisfy the following relations:
    $0 < x < 0.15$, $y=0$, $z=0$; and
    the M is any one selected from the group consisting of Sr, Cd, Pb and Tl.

9. The thermoelectric conversion materials according to claim 7,
    wherein the x, y, and z satisfy the following relations:
    $x=0$, $y=0$, $0 < z \leq 0.5$; and
    the Q2 is Se or Sb.

10. A method for producing thermoelectric conversion materials,
wherein $Bi_2O_3$, Bi, Cu, Te, and at least one selected from the group consisting of Ba, Sr, Ca, Mg, Cs, K, Na, Cd, Hg, Sn, Pb, Mn, Ga, In, Tl, As and Sb, or their oxides, are mixed and then sintered to produce the thermoelectric conversion materials defined in the claim 1.

11. The method for producing thermoelectric conversion materials according to claim 10,
wherein the sintering process is executed at a temperature of 400 to 570° C.

12. A method for producing thermoelectric conversion materials,
wherein $Bi_2O_3$, Bi, Cu, and Te are mixed with at least one selected from the group consisting of S, Se, As and Sb, or their oxides, and then at least one selected from the group consisting of Ba, Sr, Ca, Mg, Cs, K, Na, Cd, Hg, Sn, Pb, Mn, Ga, In, Tl, As and Sb, or their oxides, are selectively further mixed thereto and then sintered to produce the thermoelectric conversion materials defined in the claim 1.

13. The method for producing thermoelectric conversion materials according to claim 12,
wherein the sintering process is executed at a temperature of 400 to 570° C.

14. A thermoelectric conversion element, which includes the thermoelectric conversion materials defined in claim 1.

* * * * *